(12) United States Patent
Chung

(10) Patent No.: US 6,791,190 B1
(45) Date of Patent: Sep. 14, 2004

(54) SELF-ALIGNED CONTACT/BORDERLESS CONTACT OPENING AND METHOD FOR FORMING SAME

(75) Inventor: Chia Chi Chung, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/434,751

(22) Filed: May 9, 2003

(51) Int. Cl.$^7$ .......................... H01L 29/42; H01L 23/29
(52) U.S. Cl. ..................... 257/773; 257/774; 257/760; 257/797
(58) Field of Search ................................ 257/773, 774, 257/760, 797

(56) References Cited

U.S. PATENT DOCUMENTS 6,204,185 B1 * 3/2001 Hsu .......................... 438/692
6,429,487 B1 * 8/2002 Kunikiyo .................... 257/354
6,436,765 B1 * 8/2002 Liou et al. .................. 438/259

FOREIGN PATENT DOCUMENTS

GB          2335539 A    *  9/1999

* cited by examiner

Primary Examiner—Jasmine Clark
(74) Attorney, Agent, or Firm—Martine & Penilla, LLP

(57) ABSTRACT

A method for forming a self-aligned contact (SAC)/borderless contact opening includes forming a shallow trench isolation (STI) structure in a substrate to define an active area. A gate structure including a cap layer is formed. The gate structure is formed on the substrate and oriented perpendicular to the STI structure and the active area. An oxide spacer is formed on at least one of the sidewalls of the gate structure. A conformal liner layer is formed on the substrate covering the gate structure, the oxide spacer, and the STI structure. An inter-layer dielectric (ILD) layer is formed on the substrate covering the liner layer. The ILD layer is patterned and etched to define a SAC/borderless contact opening. A SAC/borderless contact opening structure also is described.

16 Claims, 4 Drawing Sheets

Y direction

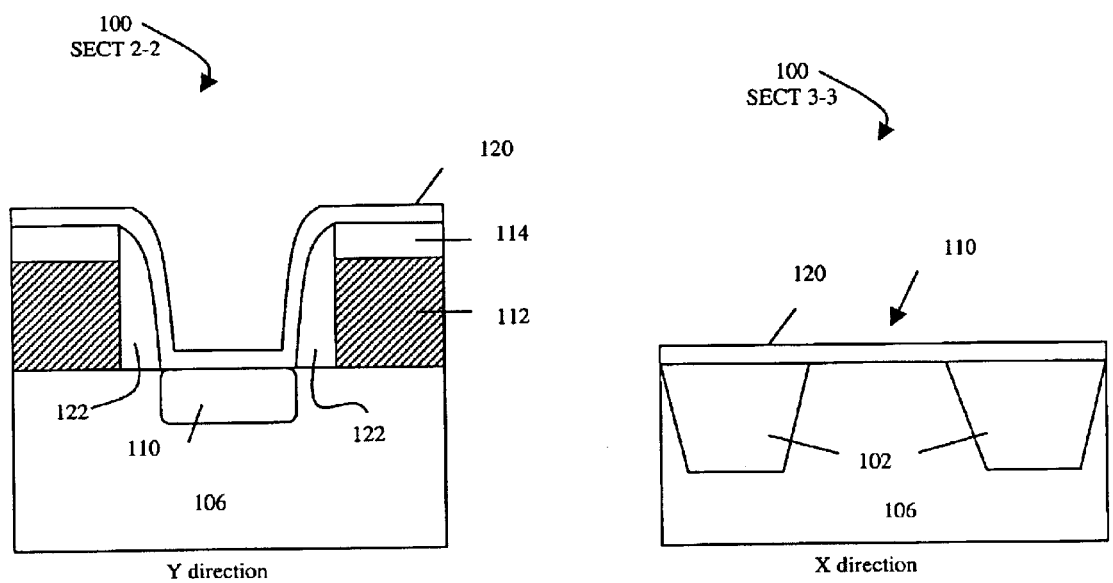
FIGURE 2  FIGURE 3

SELF-ALIGNED CONTACT/BORDERLESS CONTACT OPENING AND METHOD FOR FORMING SAME

BACKGROUND OF THE INVENTION

1. Field of the Invention

The present invention relates generally to semiconductor fabrication and, more particularly, to a self-aligned contact/borderless contact opening and a method for forming a self-aligned contact/borderless contact opening.

2. Description of the Related Art

In self-aligned contact (SAC) processes, it becomes more difficult to produce accurate results as the aspect ratio increases. The aspect ratio is the ratio of the depth of the layer (or layers) being etched as compared to the width of the feature (e.g., contact hole) being formed by the etching process. Therefore, as device densities increase with reduced feature width, the aspect ratio also increases.

Further, many conventional SAC processes use protective layers. The protective layers are typically applied in thicker layers. These thicker layers further increase the aspect ratio of the SAC process. By way of example, a conventional SAC process includes a silicon nitride cap layer and a silicon nitride spacer for protecting the gate structure during the contact opening etching process. The silicon nitride cap layer (cap layer) is typically greater than 1000 angstroms in thickness. The thicker protective layer is required to provide the desired selectivity control and protection of the gate structures during the etching processes used to form the SAC opening.

Higher aspect ratios in conventional SAC processes can also reduce the effective lithography window, which further complicates the SAC process.

In view of the foregoing, there is a need for a method for reducing the aspect ratio of the SAC process and thereby increase the lithography window.

SUMMARY OF THE INVENTION

Broadly speaking, the present invention fills this need by providing SAC processes having reduced aspect ratios. In one embodiment, the reduced aspect ratios are achieved by using a thinner protective layer or layers to protect the gate structure during an etching process. Several inventive embodiments of the present invention are described below.

In accordance with one aspect of the present invention, a method for forming a self-aligned contact (SAC)/borderless contact opening is provided. In this method, a shallow trench isolation (STI) structure is formed in a substrate to define an active area. A gate structure, which includes a cap layer, is formed. The gate structure is formed on the substrate and oriented perpendicular to the STI structure and the active area. An oxide spacer is formed on at least one of the sidewalls of the gate structure. A conformal liner layer is formed on the substrate covering the gate structure, the oxide spacer, and the STI structure. An inter-layer dielectric (ILD) layer is formed on the substrate covering the liner layer. The ILD layer is patterned to define a SAC/borderless contact opening. In one embodiment, the ILD layer is etched to form the SAC/borderless contact opening.

In one embodiment, the oxide spacer and the cap layer are comprised of silicon oxide and the conformal liner layer is comprised of silicon nitride or silicon oxynitride. In one embodiment, the ILD layer is etched with a $C_4F_6/O_2/Ar$ mixture or a $C_5F_8/CH_2F_2$ mixture.

In one embodiment, the liner layer includes several liner layers. In one embodiment, the liner layers include a first liner layer that includes at least one of the group consisting of a silicon nitride layer and a silicon oxynitride layer. The liner layers can also include a second liner layer disposed between the first layer and the cap layer, with the second liner layer being comprised of silicon oxide.

In accordance with another aspect of the present invention, a SAC/borderless contact structure is provided. This structure includes a substrate and a shallow trench isolation (STI) structure formed in the substrate to define an active area. A gate structure having a cap layer thereon is formed on the substrate and oriented perpendicular to the STI structure and the active area. The structure further includes an oxide spacer on a sidewall of the gate structure. A conformal liner layer is formed on the substrate and covers the gate structure, the oxide spacer, and the STI structure. An inter-layer dielectric (ILD) layer is formed on the substrate and covers the liner layer. The ILD layer is patterned to define a SAC/borderless contact opening.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 2 is a cross-sectional view in the Y direction taken along section 2—2 shown in FIG. 1 of a SAC/borderless contact structure formed in accordance with one embodiment of the present invention.

FIG. 3 is a cross-sectional view in the X direction taken along section 3—3 shown in FIG. 1 of a SAC/borderless contact structure formed in accordance with one embodiment of the present invention.

DETAILED DESCRIPTION OF THE EXEMPLARY EMBODIMENTS

Several exemplary embodiments of a self-aligned contact (SAC)/borderless contact opening structure and methods for forming a SAC/borderless contact opening will now be described. It will be apparent to those skilled in the art that the present invention may be practiced without some or all of the specific details set forth herein.

The SAC/borderless contact opening process is a pivotal process in semiconductor manufacturing because the accuracy of the SAC/borderless contact opening process can directly impact the manufacturing tolerance of nearly every device structure on a semiconductor substrate. A reduced aspect ratio can increase the accuracy of the SAC/borderless contact opening process. Use of thinner protective layers can reduce the aspect ratio. Further, more accurate SAC/borderless contact opening processes can also increase the effective lithography window. An increased lithography window can further simplify the process of manufacturing semiconductor devices.

Figure 1:
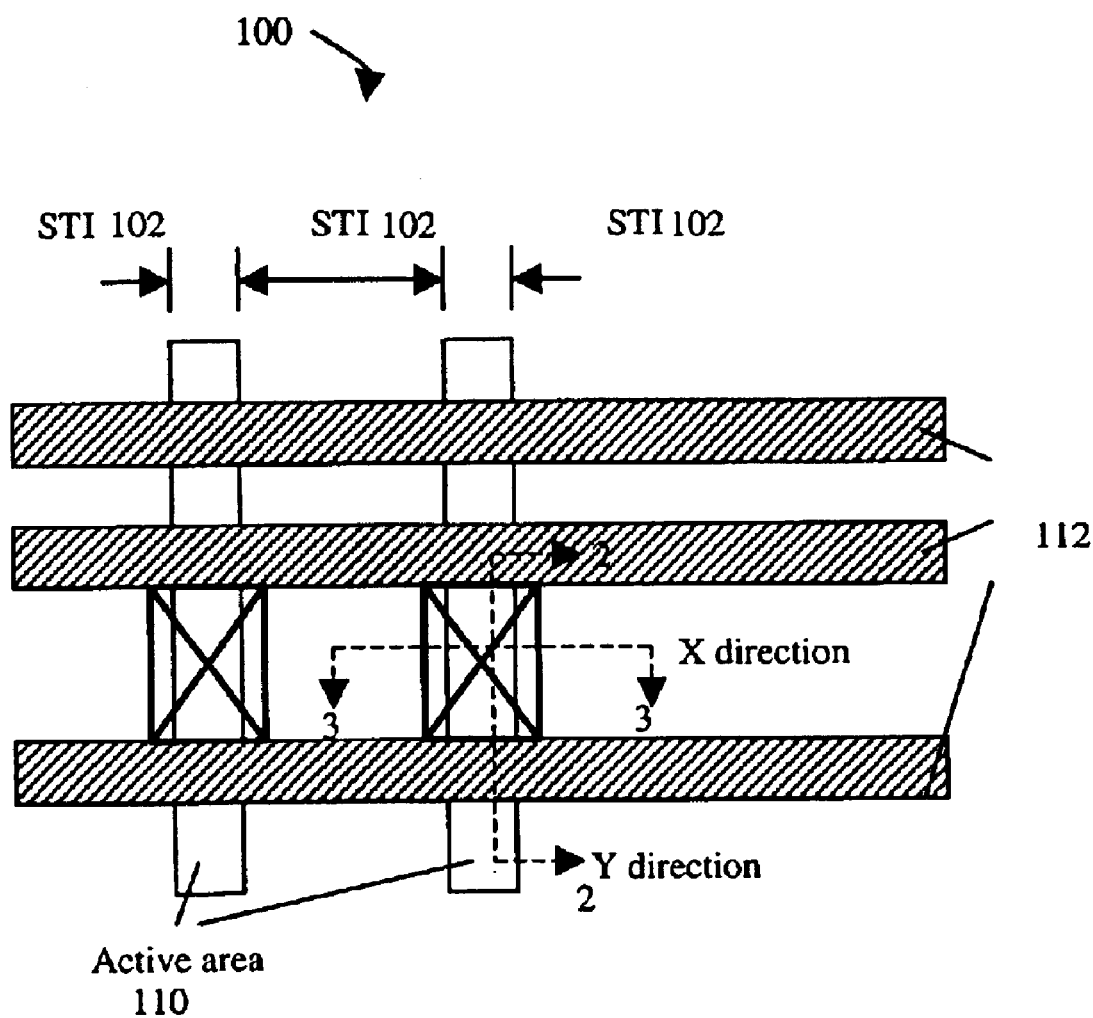
FIG. 1 is a top view of a SAC/borderless contact structure formed in accordance with one embodiment of the present invention.
Figures 4, 5:
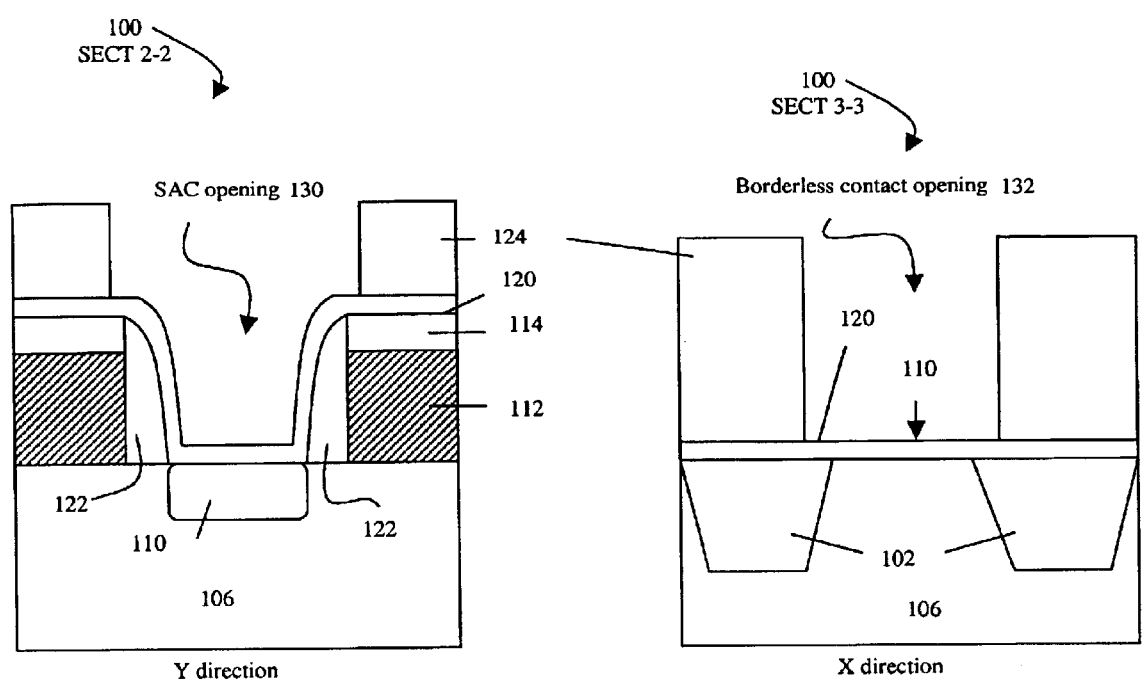
FIG. 4 is a cross-sectional view in the Y direction taken along section 2—2 shown in FIG. 1 that shows the SAC/borderless contact structure shown in FIG. 2 after additional layers and processes have been applied thereto in accordance with one embodiment of the present invention.
FIG. 5 is a cross-sectional view in the X direction taken along section 3—3 shown in FIG. 1 that shows the SAC/borderless contact structure shown in FIG. 3 after additional layers and processes have been applied thereto in accordance with one embodiment of the present invention.

FIGS. 1–5 illustrate a SAC structure/borderless contact structure 100 formed in accordance with one embodiment of the present invention. FIG. 1 is a top view illustration of one embodiment of the present invention. FIG. 2 is a cross-sectional view, in the Y direction, taken along section 2—2 shown in FIG. 1. FIG. 3 is a cross-sectional view, in the X direction, taken along section 3—3 shown in FIG. 1. FIG. 4 shows the SAC/borderless contact structure 100 shown in FIG. 2 after additional layers and processes have been applied thereto. FIG. 5 shows the SAC/borderless contact structure 100 shown in FIG. 3 after additional layers and processes have been applied thereto.

Referring now to FIGS. 1 and 3, STI structures 102 are formed in the substrate 106 to define active areas 110. Gate structures 112 are also formed on the substrate 106. In one embodiment, the gate structures 112 are formed perpendicular to the STI structures 102 and the active areas 110. The STI structures 102 that define an active area 110 are shown in FIG. 3.

Turning to FIG. 2, the active area 110, which may be formed using well-known processes, is formed within the substrate 106. The gate structure 112 is formed on the substrate 106 and a cap layer 114 is formed on the gate structure 112. In one embodiment, the cap layer 114 is a silicon oxide layer.

Significantly, the thickness of the cap layer 114 can be less than about 500 angstroms. In comparison, conventional SAC processes include cap layers that are typically 1000 angstroms or greater in thickness. Thus, the thinner cap layer 114 directly reduces the aspect ratio relative to conventional SAC processes. As used herein, the modifying term "about" includes a range of +/−10% of the specified arameter. By way of example, about 500 angstroms includes the range from 450 angstroms to 550 angstroms.

With continuing reference to FIG. 2, a spacer 122 is formed on the sidewalls of the gate structure 112. In one embodiment, the spacer 122 is comprised of silicon oxide. In the Y direction (as shown in FIG. 2), a conformal liner layer 120 covers the cap layer 114, the spacer 122, and the active area 110. In the X direction (as shown in FIG. 3), liner layer 120 covers the substrate 106 and the STI structures 102. In one embodiment, the liner layer 120 is a silicon oxynitride layer or a silicon nitride layer. If desired, the conformal liner layer 120 can include a second conformal layer (not shown in FIG. 2). The second conformal layer can be a silicon oxide layer or a layer of other suitable material. When present, the second conformal layer can be formed between the liner layer 120 and the gate structure 112 and the active area 110.

In one embodiment, the cap layer 114 and the spacer 122 are comprised of silicon oxide and the liner layer 120 is a silicon nitride layer. The cap layer 114 can be substantially thinner (i.e., less than about 500 angstroms) than a conventional cap layer, which typically has a thickness of 1000 angstroms or greater, because the combination of the silicon oxide cap layer 114 and the silicon nitride conformal liner layer 120 adequately protects the gate structure 112 during the subsequent etching processes.

As shown in FIG. 4, an inter-layer dielectric (ILD) layer 124 covers the portion of the liner layer 120 that is disposed over the cap layer 114. In one embodiment, the ILD layer 124 is a silicon oxide layer. SAC opening 130 to the active areas 110 is defined by opposing surfaces of ILD layer 124 and liner layer 120, as shown in FIG. 4.

As shown in FIG. 5, the ILD layer 124 is formed on the substrate 106 and covers the portion of the liner layer 120 that is disposed over the STI structure 102. Borderless contact opening 132 to active area 110 is defined by opposing surfaces of ILD layer 124, as shown in FIG. 5.

Figure 6:
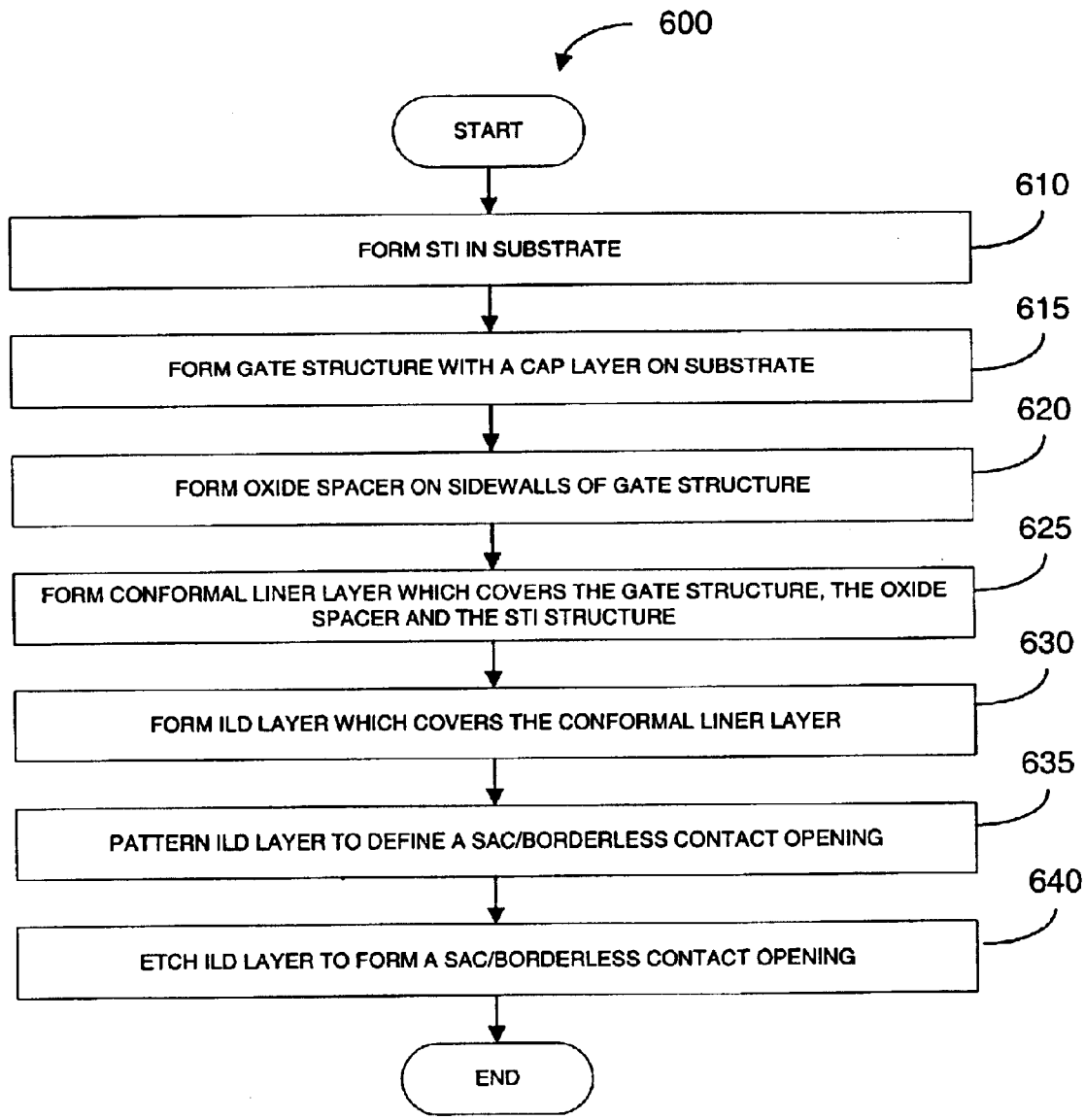
FIG. 6 is a flowchart of the method operations for forming a SAC/borderless contact structure in accordance with one embodiment of the present invention.

FIG. 6 is a flowchart of the method operations 600 for forming a SAC/borderless contact structure in accordance with one embodiment of the present invention. Referring now to FIGS. 1–3 and 6, in operation 610, the STI structure 102 is formed in the substrate to define an active area 110. The STI structure 102 is typically formed by ion implantation or other methods well known in the art. In operation 615, a gate structure 112 with a cap layer 114 is formed on the substrate 106. In one embodiment, the gate structure 112 with the cap layer 114 is formed perpendicular to the STI structures 102 and the active area 110. In operation 620, a spacer 122 is formed on the sidewalls of the gate structure 112. The spacer 122 can be silicon oxide or other suitable material.

In operation 625, a conformal liner layer 120 covering the gate structure 112, the STI structures 102, and the active area 110 is formed on the substrate 106. Alternatively, in operation 625, the liner layer 120 can be formed and a second conformal silicon oxide layer (not shown) can be formed between the liner layer 120 and the gate structure 112, the STI structures 102, and the active area 110.

Referring now to FIGS. 4–6, in operation 630, the ILD layer 124 is formed on the substrate 106 so that at least a portion of the liner layer 120 is covered. In operation 635, the ILD) layer 124 is patterned to define a self-aligned contact (SAC) opening 130 in the Y direction (see FIG. 4) and a borderless contact opening 132 in the X direction (see FIG. 5). In operation 640, the ILD layer 124 is etched to form the SAC opening 130 and the borderless contact opening 132. By way of example, the etching reactive gas recipe for patterning the MDn layer 124 can be a $C_4F_6/O_2/Ar$ mixture or a $C_5F_8/CH_2F_2$ mixture.

The selectivity of the silicon oxide material to the silicon nitride material is larger than about 25 when the etching reactive gas is used. This selectivity allows the SAC opening 130 and the borderless contact opening 132 to be accurately formed in that the sidewalls of the SAC opening 130 and the borderless contact opening 132 are more vertical without the concern of excessive etching into the active area 110.

In one embodiment, liner layer 120 allows the width of the SAC opening 130 and the borderless contact opening 132 to be increased. This is significant because it avoids the issue of high aspect ratio etching and thereby increases the lithography window. In contrast with conventional SAC processes, the cap layer 114 and the spacer 122 are not required to be silicon nitride or silicon oxynitride because the conformal liner layer 120 in combination with the thinner silicon oxide cap layer 114 and spacer 122 and the specific etching recipe sufficiently protect the gate structure 112 during the etching process.

Those skilled in the art will appreciate that the instructions represented by the operations in FIG. 6 are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming a self-aligned contact (SAC)/borderless contact opening, comprising:

forming a shallow trench isolation (STI) structure in a substrate to define an active area;

forming a gate structure having a cap layer thereon, the cap layer being comprised of silicon oxide the gate structure being formed on the substrate and being oriented perpendicular to the STI structure and the active area;

forming an oxide spacer on a sidewall of the gate structure;

forming a conformal liner layer on the substrate covering the gate structure, the oxide spacer, and the STI structure;

forming an inter-layer dielectric (ILD) layer on the substrate covering the conformal liner layer; and patterning the ILD layer to define a SAC/borderless contact opening.

2. The method of claim 1, wherein the liner layer includes a plurality of liner layers.

3. The method of claim 2, wherein the plurality of liner layers includes a first liner layer that includes at least one of the group consisting of a silicon nitride layer and a silicon oxynitride layer.

4. The method of claim 3, wherein the plurality of liner layers includes a second liner layer disposed between the first layer and the cap layer, the second liner layer comprising silicon oxide.

5. The method of claim 1, wherein the spacer is comprised of silicon oxide.

6. The method of claim 1, further comprising:

etching the ILD layer to form the SAC/borderless contact opening.

7. The method of claim 6, wherein etching the ILD layer to form the SAC/borderless contact opening includes applying an etching gas to the ILD layer, the etching gas including at least one of the group consisting of a $C_4F_6/O_2/Ar$ mixture and a $C_5F_8/CH_2F_2$ mixture.

8. A self-aligned contact (SAC)/borderless contact structure, comprising:

a substrate;

a shallow trench isolation (STI) structure formed in the substrate to define an active area;

a gate structure having a cap layer thereon, the cap layer being comprised of silicon oxide the gate structure being formed on the substrate and oriented perpendicular to the STI structure and the active area;

an oxide spacer on a sidewall of the gate structure;

a conformal liner layer on the substrate, the conformal liner layer covering the gate structure, the oxide spacer, and the STI structure; and an inter-layer dielectric (ILD) layer on the substrate covering the liner layer, the ILD layer being patterned to define a SAC/borderless contact opening.

9. The structure of claim 8, wherein the liner layer includes a plurality of liner layers.

10. The structure of claim 9, wherein the plurality of liner layers includes a first liner layer that includes at least one of the group consisting of a silicon nitride layer and a silicon oxynitride layer.

11. The structure of claim 10, wherein the plurality of liner layers includes a second liner layer disposed between the first layer and the cap layer, the second liner layer including a silicon oxide layer.

12. The structure of claim 8, wherein the spacer is comprised of silicon oxide.

13. The structure of claim 8, wherein the ILD layer is etched to form the SAC/borderless contact opening.

14. A method for forming a self-aligned contact (SAC)/borderless contact structure, comprising:

forming a shallow trench isolation (STI) structure in a substrate to define an active area;

forming a gate structure having a cap layer thereon, the gate structure being formed on the substrate and oriented perpendicular to the STI structure and the active area, the cap layer being comprised of silicon oxide;

forming a silicon oxide spacer on at least one of a plurality of sidewalls of the gate structure;

forming a conformal liner layer on the substrate covering the gate structure, the oxide spacer, and the STI structure, the conformal liner layer including at least one of the group consisting of a silicon nitride layer and a silicon oxynitride layer;

forming a inter-layer dielectric (ILD) layer on the substrate covering the liner layer; and patterning the ILD layer to define a SAC/borderless contact opening.

15. The method of claim 14, further comprising:

etching the ILD layer to form the SAC/borderless contact opening.

16. The method of claim 15, wherein etching the ILD layer to form the SAC/borderless contact opening includes applying an etching gas to the ILD layer, the etching gas including at least one of the group consisting of a $C_4F_6/O_2/Ar$ mixture and a $C_5F_8/CH_2F_2$ mixture.

* * * * *